(12) United States Patent
Andideh et al.

(10) Patent No.: US 6,350,670 B1
(45) Date of Patent: Feb. 26, 2002

(54) METHOD FOR MAKING A SEMICONDUCTOR DEVICE HAVING A CARBON DOPED OXIDE INSULATING LAYER

(75) Inventors: Ebrahim Andideh, Portland; Sam Sivakumar, Hillsboro; Larry Wong, Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/465,654

(22) Filed: Dec. 17, 1999

(51) Int. Cl.$^7$ ........................................... H01L 21/4763
(52) U.S. Cl. ..................... 438/618; 438/622; 438/634; 438/638
(58) Field of Search ................................. 438/622, 618, 438/634, 638

(56) References Cited

U.S. PATENT DOCUMENTS 5,880,035 A * 3/1999 Fukuda ....................... 438/734
6,103,616 A * 8/2000 Yu et al. ..................... 438/622

* cited by examiner

Primary Examiner—Long Pham
(74) Attorney, Agent, or Firm—Mark Seeley

(57) ABSTRACT

An improved method of forming a semiconductor device that has a carbon doped oxide insulating layer. The method comprises forming a first insulating layer that includes a carbon doped oxide, then forming on the surface of the first insulating layer a second insulating layer that comprises silicon dioxide.

15 Claims, 4 Drawing Sheets

METHOD FOR MAKING A SEMICONDUCTOR DEVICE HAVING A CARBON DOPED OXIDE INSULATING LAYER

FIELD OF THE INVENTION

The present invention relates to a method for making a semiconductor device.

BACKGROUND OF THE INVENTION

Semiconductor devices include metal layers that are insulated from each other by dielectric layers. As device features shrink, reducing the distance between the metal layers, capacitance increases. To address this problem, insulating materials that have a relatively low dielectric constant are being used in place of silicon dioxide (and other materials that have a relatively high dielectric constant) to form the dielectric layer that separates the metal lines.

A material that may be used to form such a low k dielectric layer is carbon doped oxide. Using this material instead of silicon dioxide to separate metal lines may yield a device having reduced propagation delay, cross-talk noise and power dissipation. Although carbon doped oxide enables these favorable properties, films formed from that material may be relatively incompatible with conventional lithography processes. Such films' optical reflectivity properties may prevent DUV (e.g., 157, 193, 248 nm) lithography from generating a sharp photoresist profile, which may cause CD control problems. This problem may be exacerbated if the carbon doped oxide chemically reacts with the photoresist.

Another issue relates to how conventional photoresist removal and post etch cleaning steps may affect a carbon doped oxide film's dielectric properties. The carbon contained in such a film may react with materials used to remove the photoresist or to clean vias and trenches, depleting the amount of carbon contained in the film, which raises the dielectric constant. In addition, such films may crack or absorb moisture during these processes. Excessive moisture absorption can further degrade the film's dielectric constant.

Accordingly, there is a need for an improved process for making a semiconductor device that includes a carbon doped oxide dielectric layer. There is a need for such a process that enables use of conventional lithography to form acceptable photoresist profiles. There is also a need for such a process that enables conventional photoresist removal and post etch cleaning steps to be used without significantly depleting the amount of carbon contained in the carbon doped oxide insulating layer. The method of the present invention provides such a process.

SUMMARY OF THE INVENTION

The present invention is a method of forming a semiconductor device having a carbon doped oxide insulating layer. That method comprises forming a first insulating layer that includes a carbon doped oxide. A second insulating layer is then formed on the surface of the first insulating layer. The second insulating layer has a surface that provides substantially uniform reflectivity, and protects the first insulating layer during photoresist removal and post etch cleaning steps.

DETAILED DESCRIPTION OF THE PRESENT INVENTION

Set forth below is a description of a number of embodiments of the method of the present invention for making a semiconductor device. That description is made with reference to a single damascene process, illustrated by FIGS. 1a–f, and a dual damascene process, illustrated by FIGS. 2a–e.

In the method of the present invention, first insulating layer 101 is formed on substrate 100. Substrate 100 may be any surface, generated when making a semiconductor device, upon which an insulating layer may be formed. Substrate 100 may include, for example, active and passive devices that are formed on a silicon wafer such as transistors, capacitors, resistors, diffused junctions, gate electrodes, local interconnects, etc.... Substrate 100 also may include insulating materials (e.g., silicon dioxide, either undoped or doped with phosphorus (PSG) or boron and phosphorus (BPSG); silicon nitride; silicon oxynitride; silicon carbide; carbon doped oxide; an organic containing silicon oxide; or a polymer) that separate such active and passive devices from conductive layers that are formed on top of them, and may include various types of conductive layers.

First insulating layer 101 comprises a carbon doped oxide. In a preferred embodiment of the present invention, that layer consists essentially of a carbon-doped oxide that includes between about 5 and about 50 atom % carbon. First insulating layer 101 may be formed using conventional deposition techniques, e.g., plasma enhanced chemical vapor deposition ("PECVD"). When using a PECVD process to form layer 101, gases that provide a source of silicon, oxygen, and carbon are fed into a PECVD reactor. Examples of such materials include $(CH_3)_xH_{4-x}Si$; $(CH_3)_x(CH_3O)_{4-x}Si$; $(C_xH_y)_zH_{4-z}Si$; and $(C_xH_y)_z(C_pH_qO)_{4-z}Si$—e.g., methyl, dimethyl, trimethyl and tetramethylsilane; tetramethoxysilane, methyltrimethoxysilane, dimethyldimethoxysilane, and trimethylmethoxysilane. When materials having the formula $(CH_3)_xH_{4-x}Si$ are used, oxygen or nitrous oxide ($N_2O$) should be included in the gas stream fed into the PECVD reactor. The PECVD reactor may be operated at conventional temperatures, pressures, RF and power, as will be apparent to those skilled in the art. First insulating layer 101 preferably has a thickness of between about 300 and about 3,000 nanometers. After the carbon doped oxide layer is deposited, it may be desirable in some cases to cure that layer to outgas volatile species, e.g., water, hydrogen and loosely bonded organic components.

Figure 1A:
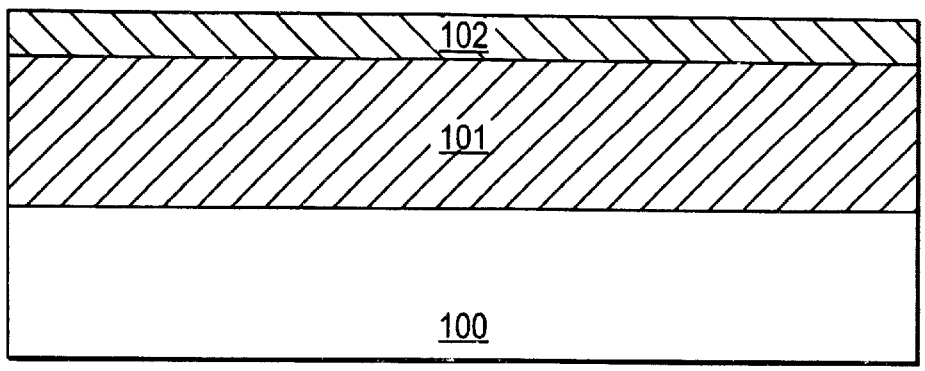
FIGS. 1a–1f are schematics of cross-sections of structures that may result when the method of the present invention is used to make a single damascene interconnect.

In the embodiment shown in FIG. 1a, second insulating layer 102 is formed as a capping layer on the surface of first insulating layer 101. Second insulating layer 102 preferably comprises silicon dioxide. Forming a silicon dioxide layer on top of a carbon doped oxide layer produces an overall insulating layer having a relatively low dielectric constant and a surface that is compatible with conventional lithography processes. In addition, such a cap layer protects the top surface of layer 101 from moisture introduced during photoresist removal and post etch cleaning steps, and from materials used in those processes.

Although second insulating layer 102 preferably comprises silicon dioxide, other materials may be used instead if they have certain properties. To be used to form second insulating layer 102, such materials should serve to ensure that first insulating layer 101 will not chemically react with a subsequently deposited layer of photoresist. In addition, they should ensure that layer 102 has a surface that provides substantially uniform reflectivity, and should protect the top surface of first insulating layer 101 from moisture absorption and materials used to remove the photoresist and to clean vias and trenches. Some examples of materials that may provide such properties include silicon nitride, silicon oxynitride and silicon carbide.

Although a few examples of the materials that may form second insulating layer 102 are described here, many others may be used, as will be apparent to those skilled in the art. Like layer 101, layer 102 may be formed using a conventional PECVD process. When layer 102 comprises silicon dioxide, silane, tetraethoxysilane or tetraethylorthosilicate (TEOS) may be used as the silicon source, as will be apparent to those skilled in the art. Second insulating layer 102 preferably has a thickness of between about 5 and about 100 nanometers. Layer 102 should be thick enough to adequately cover layer 101 (e.g., ensure that an unacceptable number of pinholes do not punch through layer 102) and to provide a substantially flat surface topology. The optimum thickness for layer 102 may depend upon the process chosen to remove from its surface a subsequently deposited conductive layer, and depend upon whether some or all of layer 102 will be retained.

Figure 1B:
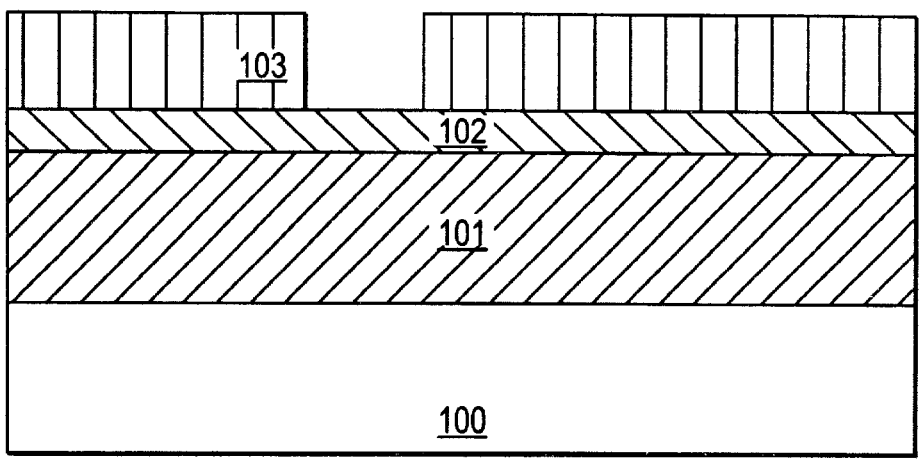
Figure 1C:
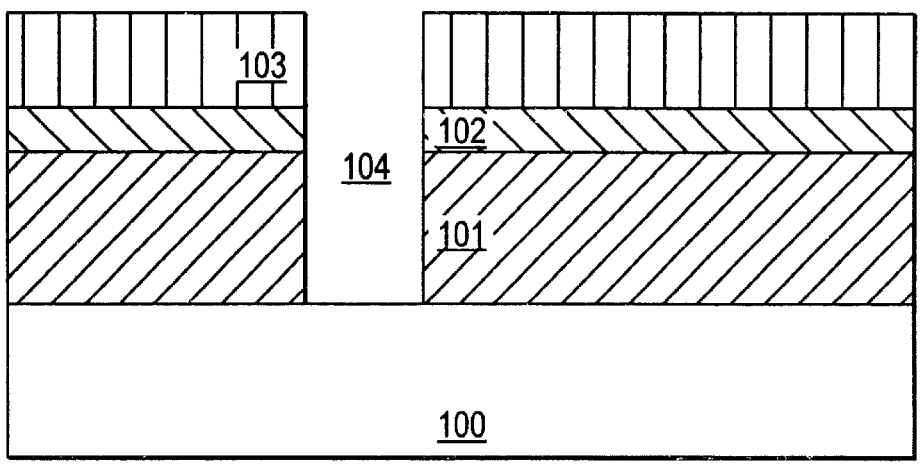

After forming second insulating layer 102, photoresist layer 103 is deposited then patterned on top of it, as shown in FIG. 1b, to define an etched region to be formed within first insulating layer 101. In the embodiment of the present invention shown in FIG. 1c, where the process of the present invention is used to form a single damascene interconnect, that etched region is via 104. In other embodiments, as described below, that etched region may be a trench for receiving a metal layer that will comprise part of a dual damascene interconnect. Photoresist layer 103 may be patterned using conventional photolithographic techniques, such as masking the layer of photoresist, exposing the masked layer to light, then developing exposed, or unexposed, portions—depending upon the type of photoresist used. Because layer 102 covers layer 101 during this process, the surface reflectivity properties of the overall insulating layer will be more like those for an insulating layer made entirely from the material used to form layer 102. Consequently, when layer 102 comprises silicon dioxide (or another material having favorable surface reflectivity characteristics), conventional lithography processes may be used to define vias and trenches—even though the underlying bulk of the insulating layer comprises a carbon doped oxide.

Via 104 may be etched through insulating layers 101 and 102 using conventional process steps, e.g., a conventional anisotropic dry oxide etch process, which may employ a medium density magnetically enhanced reactive ion etching system ("MERIE system") using a fluorocarbon based chemistry. The chemistry used may further include an effective amount of an oxidant or reducing gas to help remove the carbon included in layer 101. The amount of oxidant or reducing gas required to remove the carbon may depend upon the amount of carbon included in that layer.

Following the via etch step, photoresist layer 103 is removed. The conventional process for removing that layer uses an oxygen containing plasma. Use of such a plasma to remove photoresist from the surface of a carbon doped oxide may, however, cause the oxygen containing plasma to react with the carbon, producing carbon dioxide that is released from the device. By depleting the carbon, the insulating layer's dielectric constant can increase significantly.

One way that has been proposed to address this problem is to use a reducing gas (a.k.a. forming gas), e.g., one comprising a hydrogen and nitrogen containing plasma—or, alternatively, pure hydrogen or ammonia, instead of an oxygen based plasma to remove photoresist layer 103. But even such a hydrogen/nitrogen containing plasma can cause some oxidization of the carbon included in first insulating layer 101, when the photoresist is removed.

The method of the present invention enables use of such a forming gas chemistry, or even a low pressure/low temperature oxygen based plasma, to ash the photoresist without removing a significant amount of carbon from layer 101. By adding second insulating layer 102 onto the surface of carbon doped oxide layer 101, such a plasma cannot reach layer 101, except where it borders via 104. By protecting insulating layer 101 from the plasma used to remove the photoresist, layer 102 ensures that the photoresist removal step will not significantly affect layer 101's dielectric constant. The equipment and operating conditions for removing photoresist layer 103, using either an oxygen based or a reducing gas based ashing process, may be any of those typically used, when performing such a process step.

After removing the photoresist, via 104 is cleaned. A conventional wet chemical clean and rinse process may be employed. Because layer 102 covers layer 101, layer 101 is not exposed to the materials used in such a process (except where it borders via 104), or exposed to significant amounts of moisture. Because layer 101 is exposed to materials used in such post etch cleaning steps only along its sidewalls, those materials will not significantly degrade the relatively low dielectric constant of carbon doped oxide insulating layer 101.

Figure 1D:
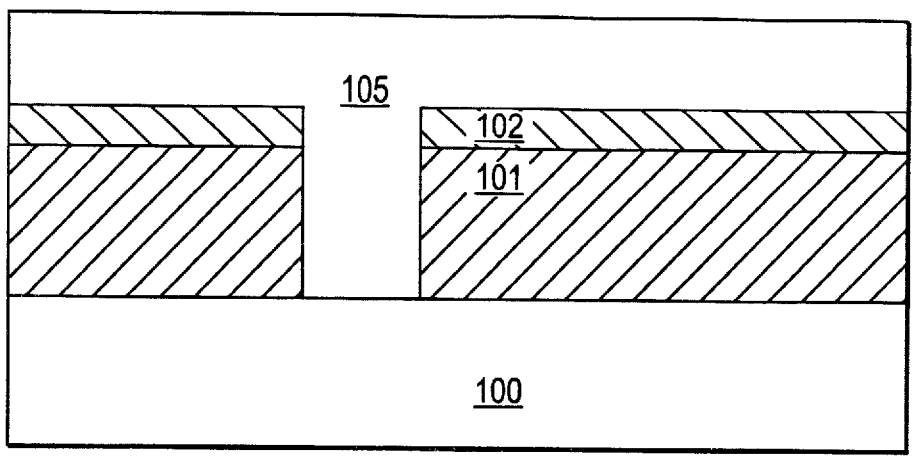

After the photoresist has been removed and the via cleaned, a conductive material is deposited on the surface of the device forming conductive layer 105, as shown in FIG. 1d. Conductive layer 105 may be used to form plugs for contacts or to connect upper and lower metal layers. Layer 105 may be made from materials conventionally used to form such structures, such as, for example, tungsten, copper, a copper alloy, aluminum or an aluminum alloy. Layer 105 may be deposited using various techniques that are well known to those skilled in the art.

Figure 1E:
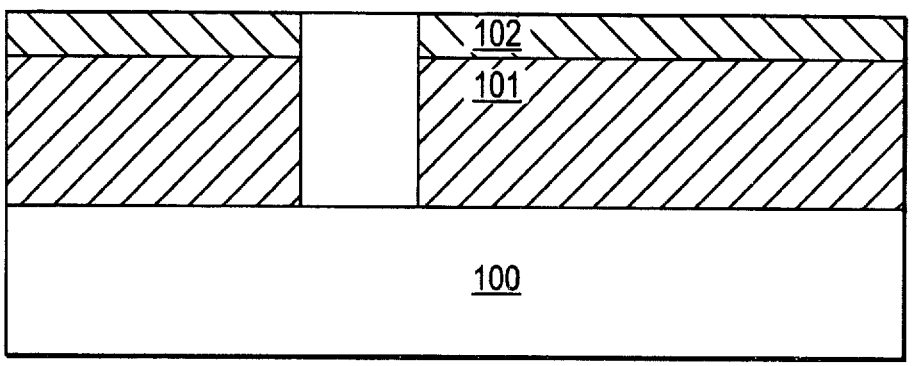
Figure 1F:
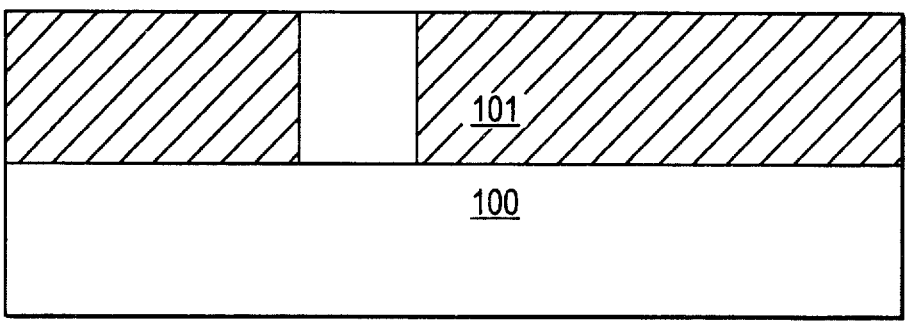

After conductive layer 105 is deposited, those portions formed on the surface of layer 102 are removed, generating the structure shown in FIG. 1e. Preferably, a conventional chemical mechanical polishing (CMP) process is used to remove those portions of layer 105, although other processes, e.g., various etching techniques, may be used instead. Although some or all of second insulating layer 102 may be retained, in a preferred embodiment of the present invention, all of second insulating layer 102 is removed to produce the structure shown in FIG. 1f. Layer 102 may be removed when conductive layer 105 is removed. Layer 102 may be removed at the same time layer 105 is removed by simply causing the CMP step to remove more material from the surface of the device. Removing all of layer 102 yields an insulating layer that takes full advantage of layer 101's low dielectric constant. After the CMP step, conventional process steps may be used to complete the semiconductor device, as will be apparent to those skilled in the art.

Figure 2A:
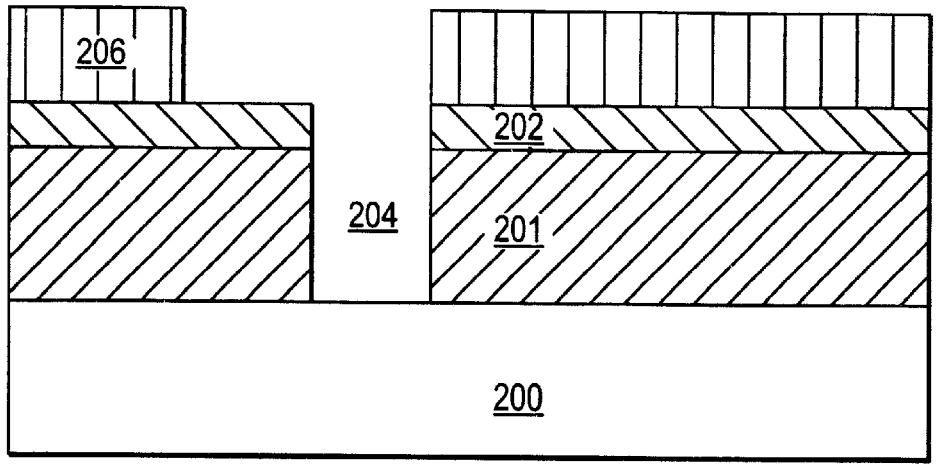
FIGS. 2a–e are schematics of cross-sections of structures that may result when the method of the present invention is used to make a dual damascene interconnect.
Figure 2B:
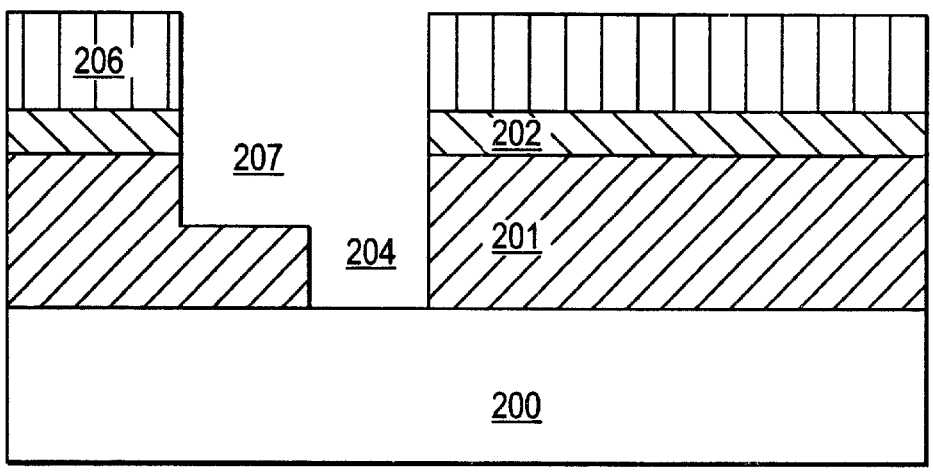
Figure 2C:
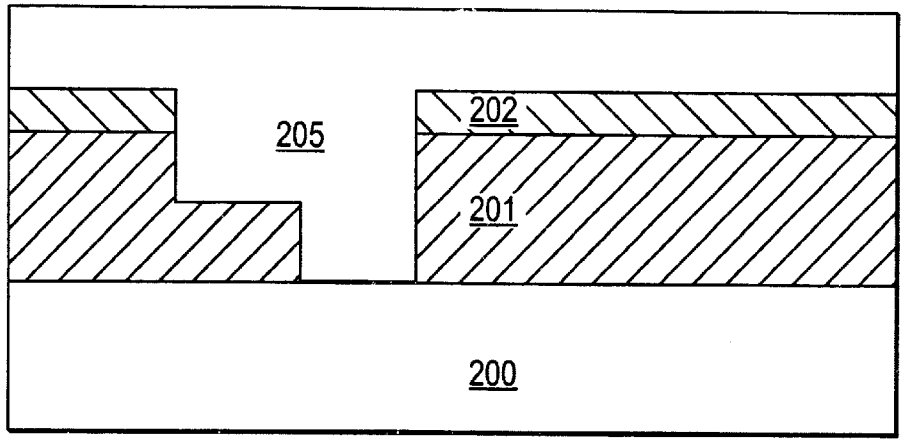
Figure 2D:
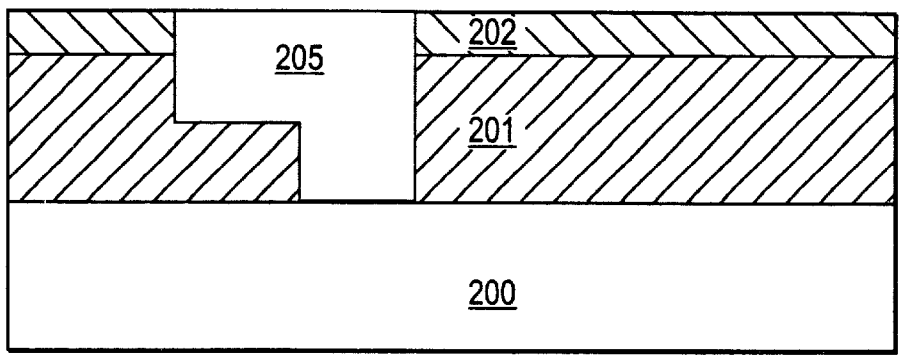
Figure 2E:
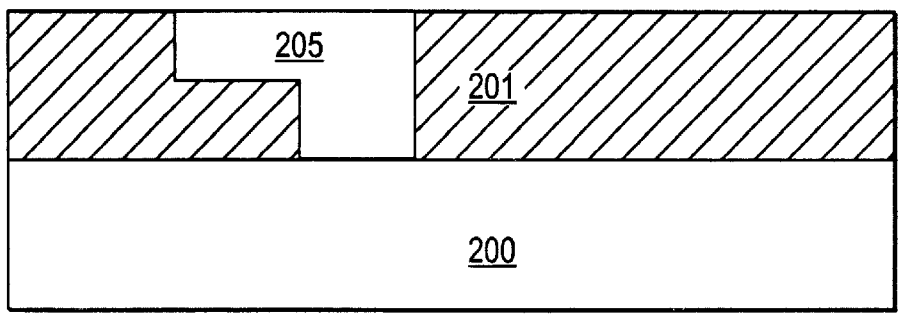

FIGS. 2a–e illustrate an embodiment of the present invention in the context of forming a dual damascene interconnect. In such a process, a second photoresist layer 206 is patterned on top of layer 202 to define trench 207—after via 204 was etched through insulating layers 201 and 202. Insulating layers 201 and 202 are formed from the materials described above in connection with layers 101 and 102. The resulting structure is shown in FIG. 2a. Trench 207 is then etched into layer 201, generating the structure shown in FIG. 2b. After the photoresist is removed, conductive layer 205 is deposited, filling via 204 and trench 207, as shown in FIG. 2c. Conductive layer 205 is then polished down to layer 202 (FIG. 2d). Preferably, that polishing step continues until all of layer 202 is also removed (FIG. 2e).

The improved method of the present invention enables use of conventional lithography and post etch clean processes to make semiconductor devices that include a carbon doped oxide insulating layer. This process ensures that the surface exposed during lithography provides relatively uniform reflectivity and ensures that photoresist removal and post etch cleaning steps will not remove significant amounts of carbon from the carbon doped oxide insulating layer. Such a method thus enables conventional process steps to be used to produce a semiconductor device with insulating layers that have a relatively low dielectric constant, which should improve the device's RC performance.

Although the foregoing description has specified certain steps, materials, and equipment that may be used in such a method, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of forming a semiconductor device comprising:
    forming a first insulating layer that includes a carbon doped oxide; then
    forming a second insulating layer on the surface of the first insulating layer, wherein the second insulating layer has a surface that provides substantially uniform reflectivity, and protects the first insulating layer during photoresist removal and post etch cleaning steps;
    depositing a conductive layer on the second insulating layer;
    removing the conductive layer from the surface of the second insulating layer; and
    removing the second insulating layer from the surface of the first insulating layer.

2. The method of claim 1 wherein the first insulating layer consists essentially of a carbon doped oxide.

3. The method of claim 2 wherein the carbon doped oxide includes between about 5 and about 50 atom % carbon.

4. The method of claim 1 wherein the second insulating layer comprises silicon dioxide.

5. The method of claim 4 wherein the second insulating layer is formed by applying a plasma enhanced chemical vapor deposition process to the substrate using silane as the silicon source.

6. The method of claim 4 wherein the second insulating layer is formed by applying a plasma enhanced chemical vapor deposition process to the substrate using tetraethylorthosilicate as the silicon source.

7. The method of claim 1 wherein the first insulating layer is between about 300 and about 3,000 nanometers thick and the second insulating layer is between about 5 and about 100 nanometers thick.

8. The method of claim 1 wherein the conductive layer and the second insulating layer are removed using a chemical mechanical polishing step.

9. The method of claim 1 further comprising:
    depositing a layer of photoresist on the surface of the second insulating layer; then
    exposing the photoresist layer to light having a wavelength less than or equal to about 248 nm.

10. A method of forming a semiconductor device comprising:
    forming a first insulating layer that includes a carbon doped oxide and that is between about 300 and about 3,000 nanometers thick;
    forming on the surface of the first insulating layer a second insulating layer that comprises silicon dioxide and that is between about 5 and about 100 nanometers thick;
    depositing a layer of photoresist on the surface of the second insulating layer; then
    exposing the photoresist layer to light having a wavelength less than or equal to about 248 nm; and then
    depositing a conductive layer on the second insulating layer, then using a chemical mechanical polishing step to remove both the conductive layer and the second insulating layer from the surface of the first insulating layer.

11. The method of claim 10, wherein the first insulating layer consists essentially of a carbon doped oxide that includes between about 5 and about 50 atom % carbon.

12. A method of forming a semiconductor device comprising:
    forming a first insulating layer that is between about 300 and about 3,000 nanometers thick and that includes a carbon doped oxide;
    forming on the surface of the first insulating layer a second insulating layer that is between about 5 and about 100 nanometers thick and that comprises silicon dioxide;
    depositing a layer of photoresist on the surface of the second insulating layer;
    exposing the photoresist layer to light having a wavelength less than or equal to about 248 nm;
    forming an etched region within the first insulating layer;
    removing the photoresist layer;
    depositing a conductive layer on the second insulating layer to fill the etched region; and
    using a chemical mechanical polishing step to remove both the conductive layer and the second insulating layer from the surface of the first insulating layer.

13. The method of claim 12 wherein the first insulating layer consists essentially of a carbon doped oxide that includes between about 5 and about 50 atom % carbon.

14. A method of forming a semiconductor device comprising:
    forming a first insulating layer that is between about 300 and about 3,000 nanometers thick and that includes a carbon doped oxide;
    forming on the surface of the first insulating layer a second insulating layer that is between about 5 and about 100 nanometers thick and that comprises silicon dioxide;
    depositing a first layer of photoresist on the surface of the second insulating layer;
    exposing the first photoresist layer to light having a wavelength less than or equal to about 248 nm;
    forming a first etched region within the first insulating layer;

removing the first photoresist layer;

depositing a second layer of photoresist on the surface of the second insulating layer;

exposing the second photoresist layer to light having a wavelength less than or equal to about 248 nm;

forming a second etched region within the first insulating layer;

removing the second photoresist layer;

depositing a conductive layer on the second insulating layer to fill the first and second etched regions; and using a chemical mechanical polishing step to remove both the conductive layer and the second insulating layer from the surface of the first insulating layer.

15. The method of claim 14 herein the first etched region is a via and the second etched region is a trench.

* * * * *